(12) United States Patent
Kuan et al.

(10) Patent No.: US 6,835,599 B2
(45) Date of Patent: Dec. 28, 2004

(54) METHOD FOR FABRICATING SEMICONDUCTOR COMPONENT WITH MULTI LAYERED LEADFRAME

(75) Inventors: Lee Choon Kuan, Singapore (SG); Chong Chin Hui, Singapore (SG); Lee Wang Lai, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/740,004

(22) Filed: Dec. 18, 2003

(65) Prior Publication Data

US 2004/0130010 A1 Jul. 8, 2004

Related U.S. Application Data

(62) Division of application No. 10/282,405, filed on Oct. 29, 2002, now Pat. No. 6,784,525.

(51) Int. Cl.[7] .............................................. H01L 21/44
(52) U.S. Cl. ....................................... 438/111; 438/123
(58) Field of Search ................................. 438/111, 123

(56) References Cited

U.S. PATENT DOCUMENTS

| | | | |
|---|---|---|---|
| 5,237,202 A | 8/1993 | Shimizu et al. | |
| 5,710,695 A | 1/1998 | Manteghi | |
| 6,020,629 A | 2/2000 | Farnworth et al. | |
| 6,054,754 A | 4/2000 | Bissey | |
| 6,075,283 A | 6/2000 | Kinsman et al. | |
| 6,130,473 A | 10/2000 | Mostafazadeh et al. | |
| 6,184,574 B1 | 2/2001 | Bissey | |
| 6,218,216 B1 | 4/2001 | Corisis | |
| 6,229,202 B1 | 5/2001 | Corisis | |
| 6,246,110 B1 | 6/2001 | Kinsman et al. | |
| 6,284,571 B1 * | 9/2001 | Corisis et al. | 438/112 |
| 6,285,560 B1 | 9/2001 | Lyne | |
| 6,294,824 B1 * | 9/2001 | Brooks et al. | 257/666 |
| 6,303,981 B1 | 10/2001 | Moden | |
| 6,303,985 B1 | 10/2001 | Larson et al. | |
| 6,310,388 B1 | 10/2001 | Bissey | |
| 6,310,390 B1 | 10/2001 | Moden | |
| 6,383,845 B2 * | 5/2002 | Masuda et al. | 438/123 |
| 6,387,732 B1 | 5/2002 | Akram | |
| 6,391,687 B1 | 5/2002 | Cabahug et al. | |
| 6,429,528 B1 | 8/2002 | King et al. | |
| 6,451,624 B1 | 9/2002 | Farnworth et al. | |
| 6,458,617 B1 * | 10/2002 | Liao et al. | 438/51 |
| 6,501,165 B1 | 12/2002 | Farnworth | |
| 6,506,625 B1 | 1/2003 | Moden | |
| 6,552,427 B2 | 4/2003 | Moden | |
| 6,589,810 B1 | 7/2003 | Moden | |

OTHER PUBLICATIONS

Rao R. Tummala and Eugene J. Rymaszewski, Microelectronics Packaging Handbook, 1989, pp. 578–586, Van Nostrand Reinhold, New York.

* cited by examiner

*Primary Examiner*—Trung Dang
(74) *Attorney, Agent, or Firm*—Stephen A. Gratton

(57) ABSTRACT

A semiconductor package includes a semiconductor die having a circuit side and a back side, a multi layered leadframe attached to the die, a dense array of terminal contacts in electrical communication with the die, and a plastic body encapsulating the die and the leadframe. The leadframe includes circuit side leads attached to the circuit side of the die, and back side leads located proximate to the back side of the die. Both the circuit side leads and the back side leads are wire bonded to bond pads on the die. In addition, the back side leads provide electrical paths between the bond pads and selected terminal contacts that would otherwise be inaccessible due to line/space design rules. A method for fabricating the package includes the steps of: attaching the die to the circuit side leads, attaching the back side leads to the circuit side leads, wire bonding the die to the leads, encapsulating the die, and then forming the terminal contacts.

22 Claims, 5 Drawing Sheets

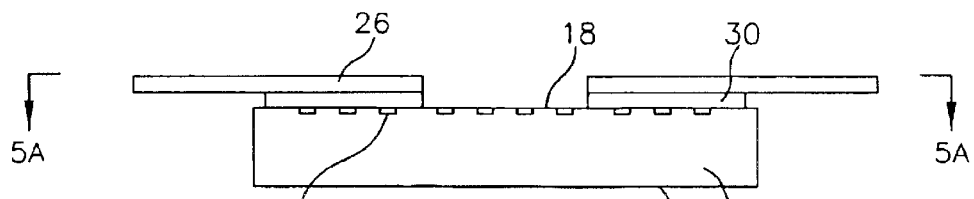
FIGURE 4A
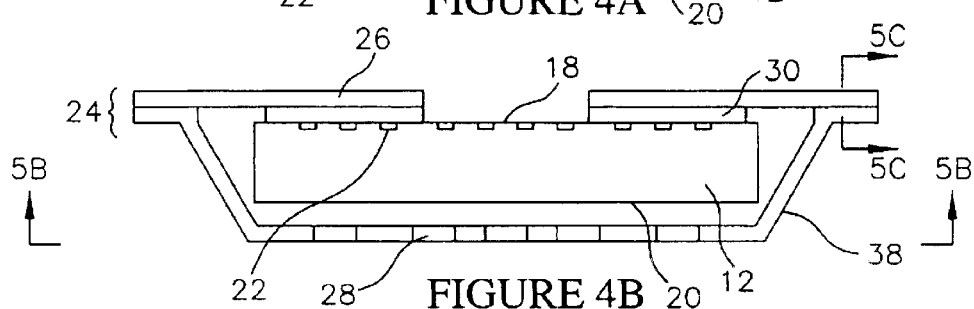
FIGURE 4B
FIGURE 4C
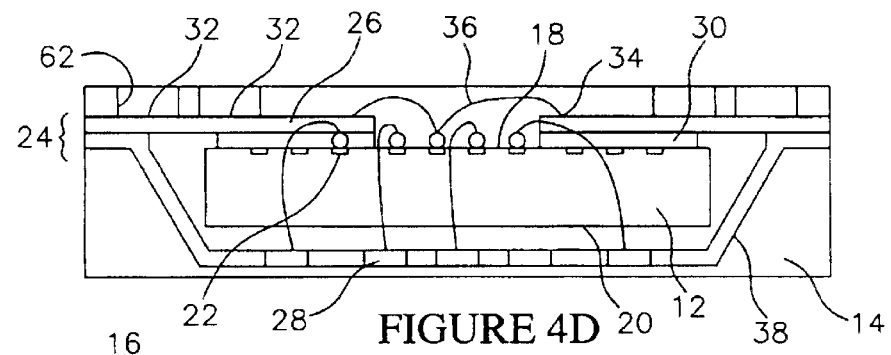
FIGURE 4D
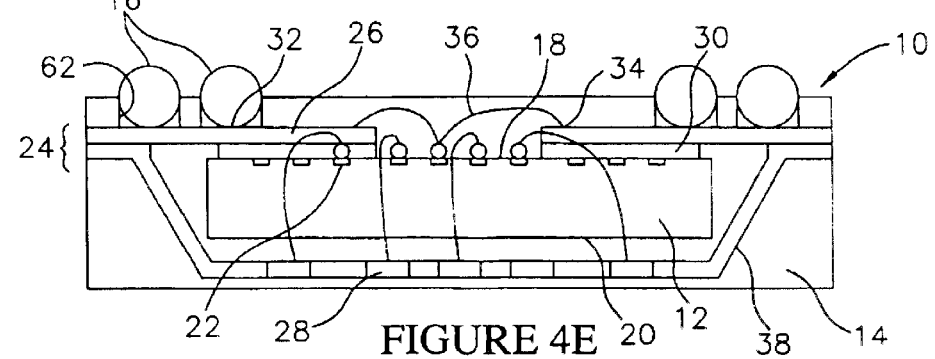
FIGURE 4E

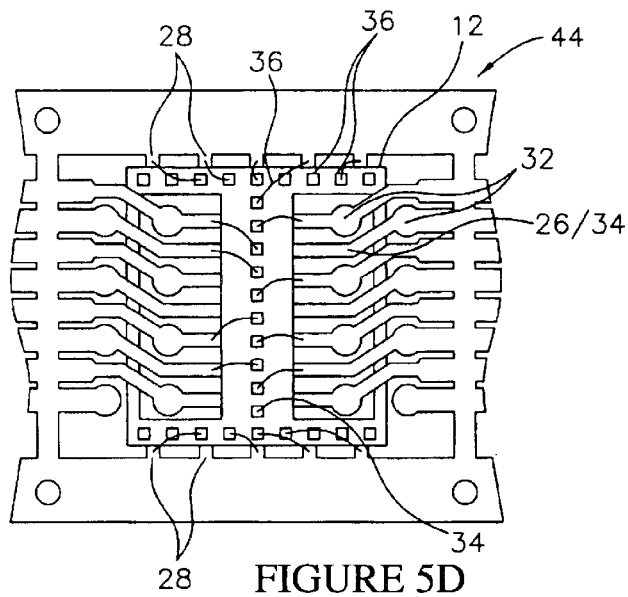
FIGURE 5D
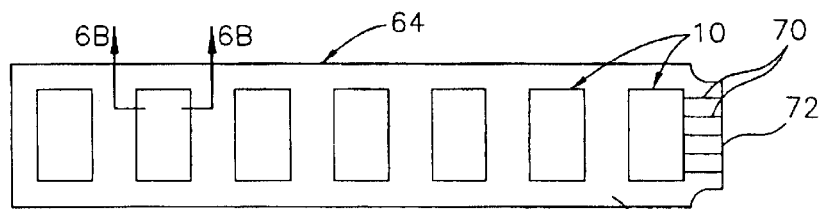
FIGURE 6A
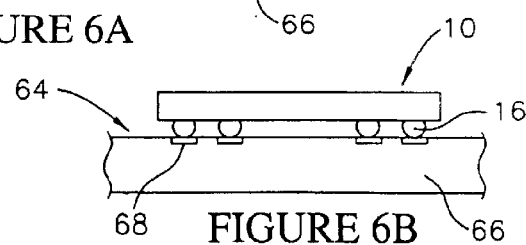
FIGURE 6B
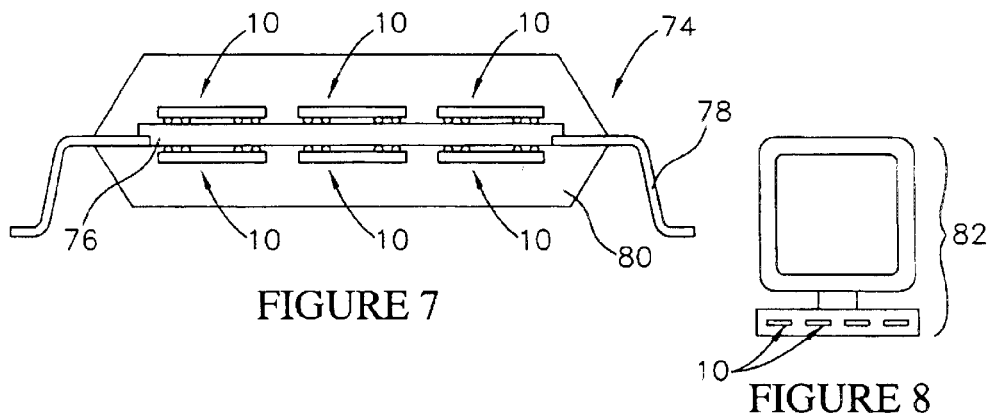
FIGURE 7
FIGURE 8

METHOD FOR FABRICATING SEMICONDUCTOR COMPONENT WITH MULTI LAYERED LEADFRAME

CROSS REFERENCE TO RELATED APPLICATIONS

This application is a division of Ser. No. 10/282,405, filed Oct. 29, 2002 now U.S. Pat. No. 6,784,525.

FIELD OF THE INVENTION

This invention relates generally to semiconductor manufacture and packaging. More particularly, this invention relates to a semiconductor package having a multi layered leadframe, to a method for fabricating the package, and to systems incorporating the package.

BACKGROUND OF THE INVENTION

Semiconductor packages, particularly chip scale packages, are being manufactured with a smaller outline and with a higher pin count than conventional plastic or ceramic packages. A chip scale package includes a semiconductor die, and terminal contacts for surface mounting the package to a supporting substrate, such as a circuit board or module substrate. The terminal contacts typically comprise balls, bumps or pins, arranged in a dense area array, such as a ball grid array (BGA), or a pin grid array (PGA). Chip scale packages can also include an encapsulant which at least partially encapsulates the die and electrical connections with bond pads on the die.

Different methods are employed in the industry for fabricating chip scale packages. One conventional method uses a rigid substrate, such as a reinforced polymer laminate, attached to the die in a chip on board (COB) or a board on chip (BOC) configuration. The substrate includes conductors, such as copper traces, that are wire bonded to the bond pads on the die. The substrate can also include bonding sites in electrical communication with the conductors for mounting the terminal contacts in the required area array.

Another method for fabricating chip scale packages employs a flexible interposer, similar to TAB tape, which includes conductors configured for bonding directly to the bond pads on the die. The flexible interposer can also include bonding sites for the terminal contacts.

Yet another method for fabricating chip scale packages uses a metal leadframe that is attached and wire bonded to the die. The metal leadframe includes leads which provide bonding sites for the wire bonds to the die, and the terminal contacts for the package. A lead on chip leadframe includes leads that are also adhesively attached to the face of the die.

Each of these fabrication methods has advantages and disadvantages. One advantage of packages formed with rigid substrates, and with flexible interposers, is that fine pitch standards can be employed. Standard setting bodies for the semiconductor industry, such as JEDEC and EIAJ, set the pitch standards for semiconductor packages. In general the "pitch" of the terminal contacts on a package is the center to center spacing between adjacent terminal contacts. Currently, the finest pitch standard employed for BGA packages is 0.50 mm, but finer pitches are anticipated.

In order to achieve these fine pitch standards, design rules on the width and the spacing of the conductors for the terminal contacts are employed. These design rules are sometimes referred to as line/space rules. Currently, rigid substrates can include conductors having a width and spacing as small as about 50 $\mu$m. Flexible interposers can include conductors having a width and a spacing as small as about 35 $\mu$m. In contrast, the leads on metal leadframes can be made with a width and a spacing of only about 80 $\mu$m for etched leadframes, and a width and a spacing of only about 70 $\mu$m for stamped leadframes.

Besides finer pitches, another advantage of rigid substrates and flexible interposers over leadframes, is that ground and power planes can be employed for grounding and powering, or for adjusting the impedance of selected terminal contacts on the packages. In addition, both rigid substrates and flexible interposers can be used with different bond pad configurations such as center line patterns, T patterns or I patterns. In contrast, metal leadframes typically do not include ground and/or power planes, and are employed mostly with center line patterns of bond pads.

Despite these disadvantages metal leadframes still possess some advantages. In particular, metal leadframes are less expensive to manufacture than rigid substrates and flexible interposers. In addition, conventional packaging equipment such as wire bonders, die attachers, conveyors and magazines can be employed with metal leadframes. Accordingly packages can be made cheaper and more reliably with Metal leadframes than with rigid substrates and flexible interposers.

The present invention is directed to a semiconductor package constructed with a metal leadframe that is able to accommodate finer line/space design rules than conventional stamped or etched metal leadframes. In addition, the leadframe can include a ground and/or power plane, and can accommodate dies having different patterns of bond pads including T patterns and I patterns.

SUMMARY OF THE INVENTION

In accordance with the present invention, an improved semiconductor package, a method for fabricating the package, and electronic systems incorporating the package are provided.

The package includes a semiconductor die having a circuit side, an opposing back side and a pattern of bond pads on the circuit side. The package also includes a multi layer leadframe attached and wire bonded to the die, a pattern of terminal contacts on the multi layer leadframe, and a plastic body encapsulating the die and the leadframe. The multi layer leadframe includes a first leadframe and a second leadframe attached to the first leadframe.

The first leadframe includes a plurality of first leads (circuit side leads) attached to the circuit side of the die and having bonding sites wire bonded to the die. The first leads also include pads arranged in an area array and configured for bonding the terminal contacts thereto. The second leadframe includes a plurality of second leads (back side leads) having bonding sites located proximate to the backside of the die and connecting segments attached to the first leads. The wire bonding sites on the second leads are located outside of the periphery of the die to provide access for wire bonding.

The leads form the internal lead system for the package, and provide electrical paths between the die and the terminal contacts for the package. In addition, the second leads can be configured to provide electrical paths to selected terminal contacts that would otherwise be non-accessible due to line/space design limitations. The second leads can also be configured to provide a ground and/or power plane for the package.

The method for fabricating the package includes the steps of attaching the first leads to the circuit side of the die, and then attaching the second leads to the first leads. In addition, the method includes the step of wire bonding wires to the bond pads on the die and to the bonding sites on the leads. The method also includes the steps of forming the plastic body, and forming the terminal contacts on the pads of the first leads.

The package can be used to construct electronic systems such as modules, circuit boards, systems in a package (SIP) and computers.

BRIEF DESCRIPTION OF THE DRAWINGS

FIGS. 4A–4E are schematic cross sectional views illustrating steps in a method for fabricating the package;

FIG. 5D is a view taken along line 5D—5D of FIG. 4C illustrating wire bonding to the circuit side leads and back side leads;

FIG. 6A is a view of a semiconductor multi chip module system incorporating packages constructed in accordance with the invention;

FIG. 6B is a schematic cross sectional view of the module taken along section line 6B—6B of FIG. 6A;

FIG. 7 is a schematic cross sectional view illustrating a package in a system (SIP) incorporating packages constructed in accordance with the invention; and FIG. 8 is a schematic view illustrating a computer system incorporating packages constructed in accordance with the invention.

DETAILED DESCRIPTION OF THE PREFERRED EMBODIMENTS

Figure 1A:
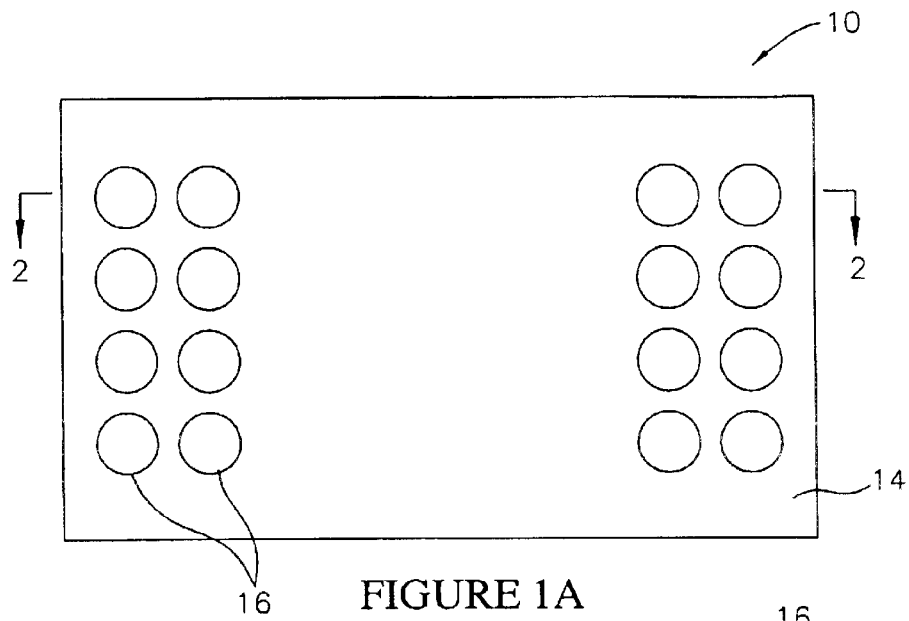
FIG. 1A is a view of a semiconductor package constructed in accordance with the invention.
Figure 1B:
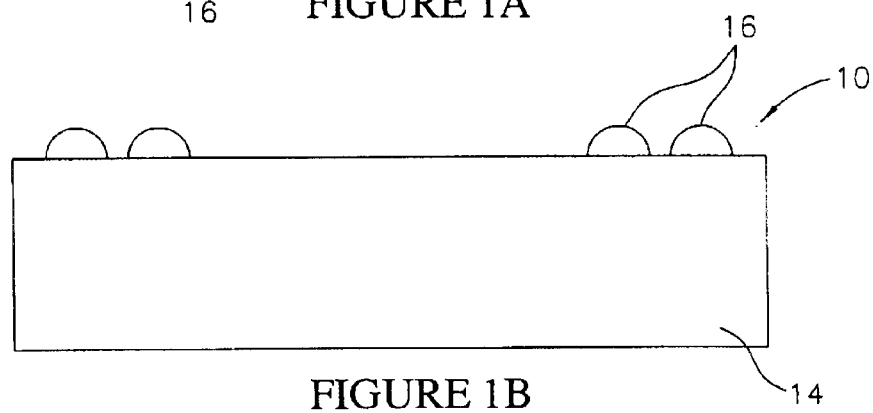
FIG. 1B is a side elevation view of the package.
Figure 2:
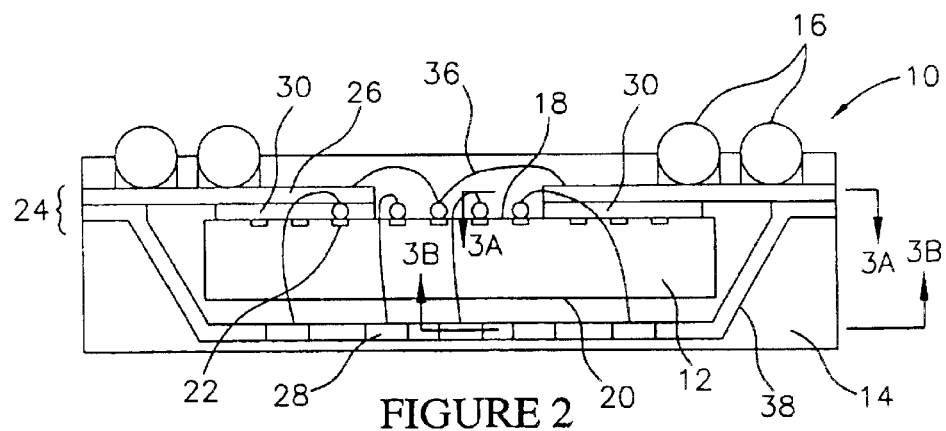
FIG. 2 is a schematic cross sectional view of the package taken along section line 2—2 of FIG. 1A.

Referring to FIGS. 1A–1B and 2, a semiconductor package 10 constructed in accordance with the invention is illustrated. The package 10 includes a semiconductor die 12, a plastic body 14 and a plurality of terminal contacts 16 in a dense area array projecting from the plastic body 14.

The die 12 can comprise a conventional semiconductor die having a desired electrical configuration. For example, the die 12 can comprise a dynamic random access memory (DRAM), a static random access memory (SRAM), a flash memory, a microprocessor, a digital signal processor (DSP) or an application specific integrated circuit (ASIC). In addition, the die 12 can have any polygonal shape, which in the illustrative embodiment is rectangular.

As shown in FIG. 2, the die 12 has a circuit side 18 and a back side 20. In addition, the die 12 includes a pattern of bond pads 22 on the circuit side 18 in electrical communication with the integrated circuits contained on the die 12. In the illustrative embodiment, the bond pads 22 are arranged in an I pattern (i.e., located along the center line and opposing peripheral edges of the die 12). However, the bond pads 22 can be arranged in other configurations, such as center patterns and T patterns.

The plastic body 14 comprises a molded plastic, such as a Novolac resin, formed using a suitable molding process in a required size and shape. The plastic body 14 completely encapsulates the die 12 and the electrical connections with the die 12. In addition, the plastic body 14 has a generally rectangular peripheral outline that is only slightly larger than the peripheral outline (i.e., footprint) of the die 12 (e.g., 1.2×).

The terminal contacts 16 provide electrical connection points to the outside, and allow the package 10 to be surface mounted to a supporting substrate, such as a circuit board or a module substrate. In the illustrative embodiment the terminal contacts 16 comprise metal balls in a ball grid array (BGA). However, rather than comprising balls, the terminal contacts 16 can comprise bumps, pins, pads or any other type of external contact used in the art. In addition, for simplicity the ball grid array is illustrated as having only four rows and four columns with two of the columns separated by a space. However, the terminal contacts 16 can be arranged in other dense area arrays, such as a solid grid pattern of equally spaced rows and columns.

As used herein, the term "dense area array" refers to a contact pattern in which the density of the terminal contacts 16 is high in relation to the total area occupied by the terminal contacts 16. This relationship is sometimes referred to as a "packing fraction". In general, the packing fraction of a pattern of contacts is the area occupied by the contacts over the total area available. In general, a "dense area array" will have a packing fraction of 0.25 or greater.

As shown in FIG. 2, the package 10 also includes a multi layer leadframe 24 which is attached and wire bonded to the die 12. The leadframe 24 includes a first leadframe which comprises a pattern of circuit side leads 26 (first leads), and a second leadframe which comprises a pattern of back side leads 28 (second leads). The circuit side leads 26 and the back side leads 28 are also known in the art as "leadfingers".

Figure 3A:
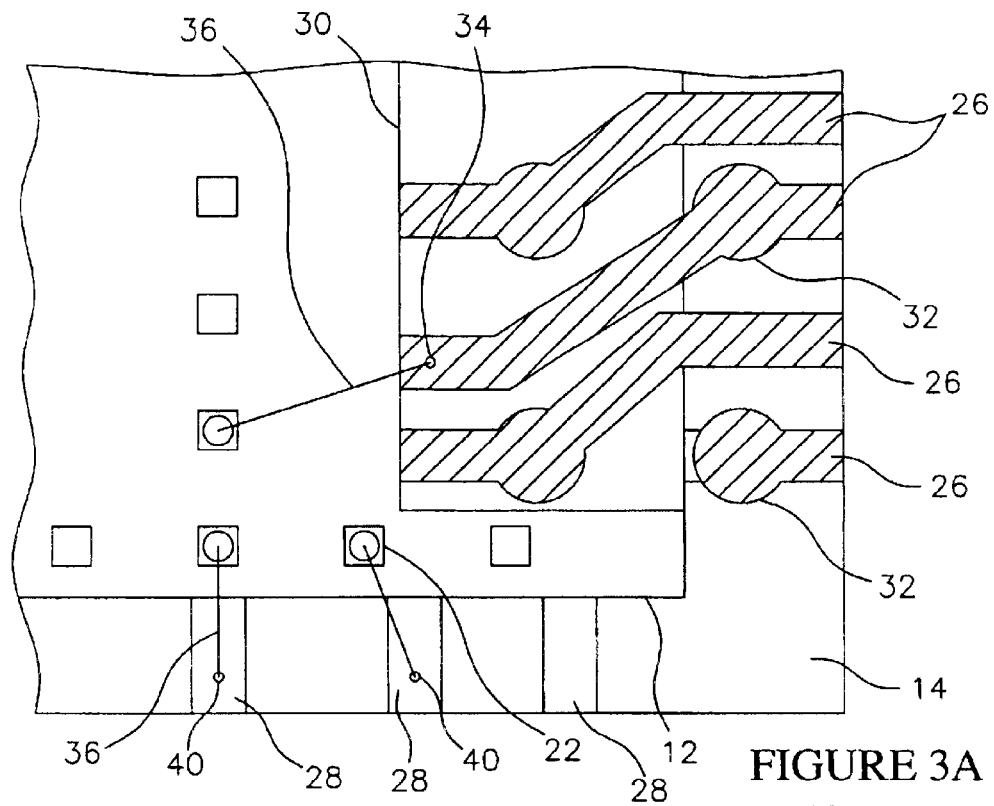
FIG. 3A is a partial schematic cross sectional view of the package taken along section line 3A—3A of FIG. 2.

One or more adhesive members 30 attach the circuit side 18 of the die 12 to the bottom sides of the circuit side leads 26. The adhesive members 30 can comprise a conventional die attach material, such as a tape material (e.g., LOC tape), or a deposited and cured adhesive layer (e.g., epoxy). In the illustrative embodiment, there are two adhesive members 30 on either side of the die 12. As shown in FIG. 3A, the adhesive members 30 do not completely cover the circuit side 18 of the die 12, and are shaped to leave the bond pads 22 on the die 12 exposed and accessible for wire bonding.

As shown in FIG. 3A, the circuit side leads 26 overlap the die 12, and are configured to support the die 12 during wire bonding and fabrication of the package 10. In addition, the circuit side leads 26 include ball bonding pads 32 on their top sides for bonding the terminal contacts 16 to the circuit side leads 26. The ball bonding pads 32 can be arranged in a desired pattern such as a dense area array. The circuit side leads 26 also include bonding sites 34 on their top sides for wire bonding wires 36 to the circuit side leads 26. The wires 36 are also wire bonded to the bond pads 22 on the die 12.

As shown in FIG. 2, the back side leads 28 are located proximate to, but spaced from, the back side 20 of the die 12. In addition, the back side leads 28 include connecting segments 38 that attach and electrically connect the back side leads 28 to selected circuit side leads 26. As will be further explained, the connecting segments 38 are attached to selected circuit side leads 26 using an electrically conductive attachment process, such as welding, brazing, soldering or conductive polymer bonding.

The connecting segments 38 are angled members that span the gap between the back side leads 28 and the circuit side leads 26. This gap is approximately equal to the thickness of the die 12. The back side leads 28 provide electrical paths between the bond pads 22 on the die 12 and selected terminal contacts 16 that would otherwise be inaccessible due to line/space design rules.

Figure 3B:
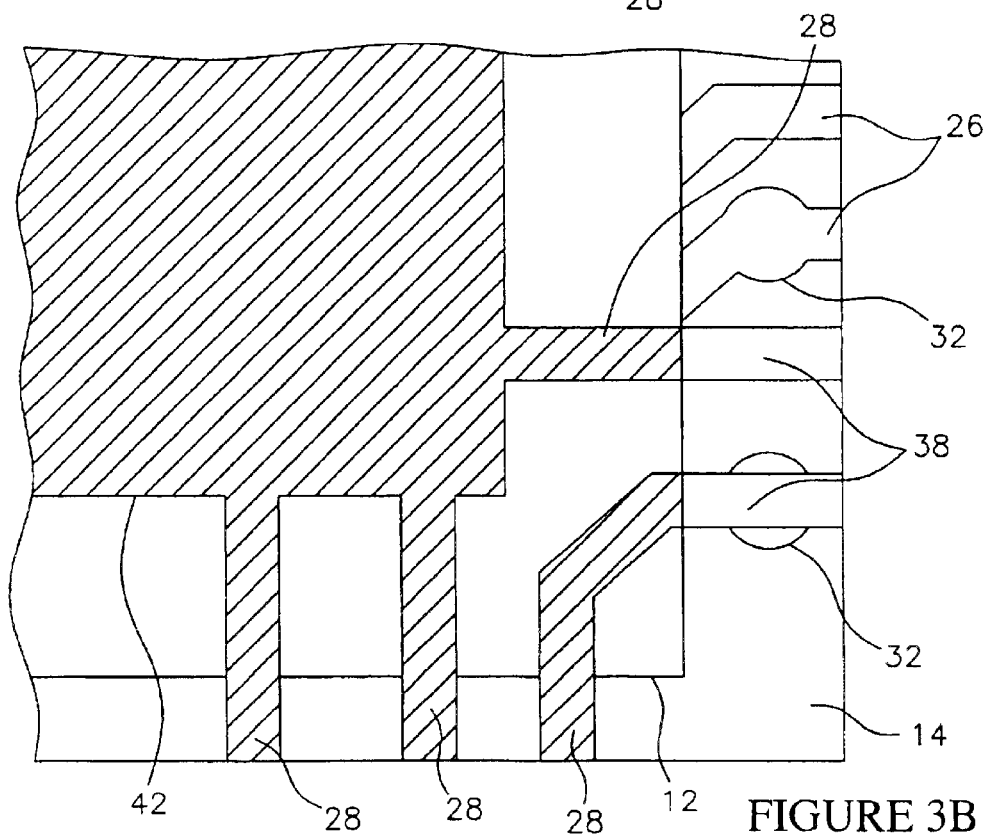
FIG. 3B is a partial schematic cross sectional view of the package taken along section line 3B—3B of FIG. 2.

As shown in FIG. 3B, portions of the back side leads 28 extend outside of the periphery of the die 12 (i.e., past the edges), such that access is provided for wire bonding. In particular, as shown in FIG. 3A, wires 36 are wire bonded to the bond pads 22 on the die 12 and to exposed bonding sites 40 on the back side leads 28. The backside leads 28 thus include the bonding sites 40 which are located proximate to the back side 20 die 12, and the connecting segments 38 that span the thickness of the die 12 and attach to the circuit side leads 26.

As shown in FIG. 3B, the multi layer leadframe 24 can also include a ground and/or power plane 42 in electrical communication with selected back side leads 28. The ground and/or power plane 42 allows selected bond pads 22 and selected terminal contacts 16 to be grounded.

Referring to FIGS. 4A–4E, steps in a method for fabricating the semiconductor package 10A are illustrated. Initially, as shown in FIG. 4A, a die attachment step is performed in which the semiconductor die 12 is attached to the bottom sides of the circuit side leads 26.

Figure 5A:
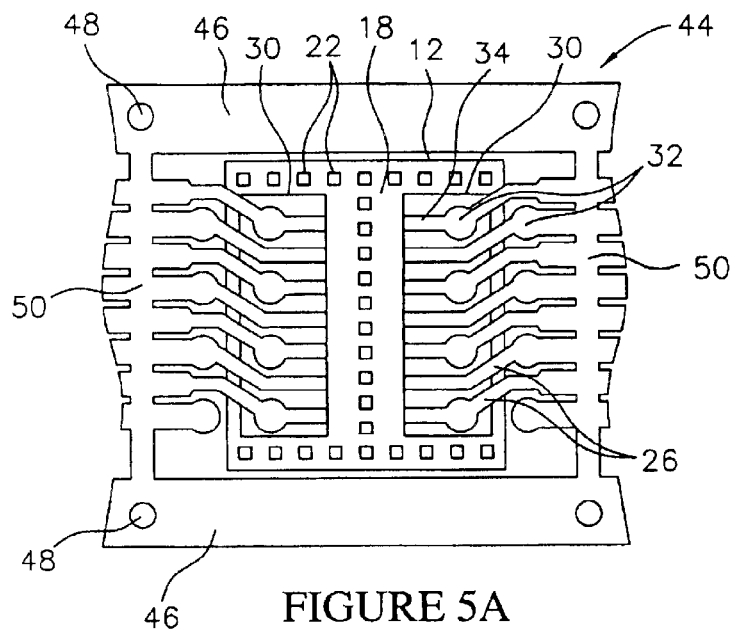
FIG. 5A is a view taken along line 5A—5A of FIG. 4A illustrating a circuit side leadframe strip and circuit side leads.

As shown in FIG. 5A, the circuit side leads 26 are originally contained on a circuit side leadframe strip 44. The circuit side leadframe strip 44 includes a plurality of separate patterns of circuit side leads 26, such that multiple packages 10 can be fabricated and then singulated from one another. In the illustrative embodiment, the circuit side lead frame strip 44, and the leads 26, have a lead on chip (LOC) configuration, and the die 12 is attached directly to the circuit side leads 26.

The circuit side leadframe strip 44 can comprise a nickel-iron alloy (e.g., 42% Nickel-58% Iron), a clad material (e.g., copper clad stainless steel) or a copper alloy. Conventional fabrication processes such as stamping or chemical etching can be used to form the circuit side leadframe strip 44. The circuit side leadframe strip 44 includes parallel spaced side rails 46 with indexing openings 48. The side rails 46 and indexing openings 48 permit handling by automated equipment such as conveyors, magazines and traces. Also, the circuit side leadframe strip 44 includes connecting bars 50 for the circuit side leads 26 which are cut away during the singulation process. The connecting bars 50 rigidify the circuit side leads 26 and facilitate plating of the leads 26.

As also shown in FIG. 4A, the die 12 is attached to bottom sides of the circuit side leads 26 using the adhesive members 30. The adhesive members 30 are sized and shaped such that the bond pads 22 on the die 12 remain exposed. In addition, the ball bonding pads 32 and the bonding sites 34 as well, are on the opposite top sides of the circuit side leads 26 (exposed sides) and remain clear of the adhesive members 30. The adhesive members 30 can comprise a polymer tape, such as LOC tape, having an adhesive formed on one or both major surfaces thereof. A conventional die attacher can be used to adhesively attach the adhesive members 30 to the die 12, and the die 12 to the circuit side leads 26. Alternately, a die attach adhesive, such as a filled epoxy, an unfilled epoxy, an acrylic, or a polyimide material can be employed to form the adhesive members 30.

Figure 5C:
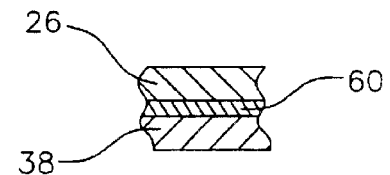
FIG. 5C is a cross sectional view taken along section line 5C—5C of FIG. 4B illustrating attachment of the circuit side leads and the back side leads.
Figure 5B:
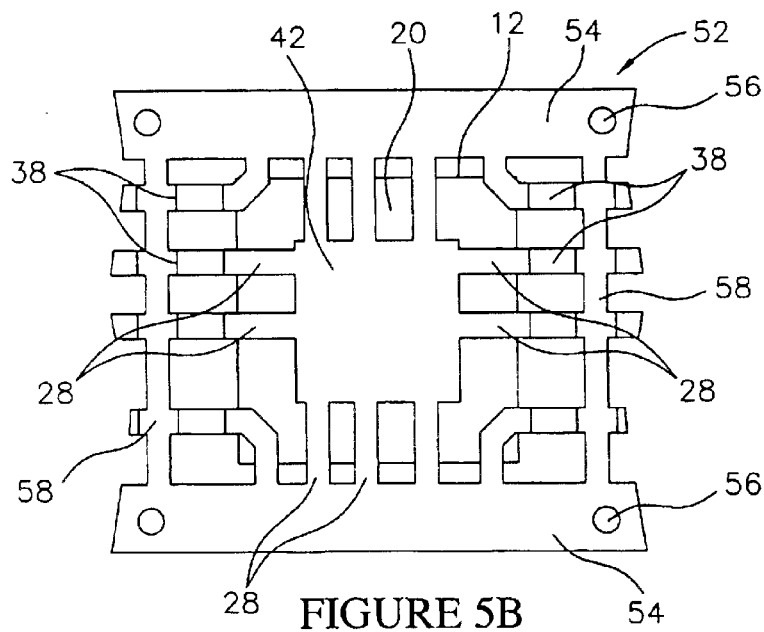
FIG. 5B is a view taken along line 5B—5B of FIG. 4B illustrating a back side leadframe strip and back side leads.

Following the die attach step, and as shown in FIG. 4B, a leadfinger attachment step is performed in which the back side leads 28 are attached to the circuit side leads 26. As shown in FIG. 5B, the back side leads 28 can initially be contained on a back side leadframe strip 52. The back side leadframe strip 52 can be similar in construction to the circuit side leadframe strip 44, and can be constructed using the same processes and materials. As such, the back side leadframe strip 52 includes side rails 54 having indexing openings 56, and connecting bars 58 for connecting the back side leads 28. The back side leadframe strip 52 also includes the ground and/or power plane 42 which is connected to selected back side leads 28.

As also shown in FIG. 4B, attachment of the back side leads 28 to the circuit side leads 26 forms the multi layered leadframe 24. The leadfinger attachment step can be performed using a suitable process, such as a welding process, a brazing process, a soldering process or a conductive adhesive bonding process. In addition, as shown in FIG. 5C, a conductive layer 60, such as a bonded metal or a cured conductive polymer, can be formed between the back side leads 28 and the circuit side leads 26 during the leadfinger attachment step.

Following the leadfinger attachment step, and as shown in FIG. 4C, a wire bonding step is performed. During the wire bonding step, the wires 36 are wire bonded to the bond pads 22 on the die 12, to the bonding sites 34 on the circuit side leads 26 and to the bonding sites 40 on the back side leads 28. A conventional wire bonder can be used to perform the wire bonding step. In addition, the bonding sites 34, 40 can include a wire bondable metal layer, such as gold or silver plating, to facilitate the wire bonding process.

As shown in FIG. 5D, the bonding sites 40 on the back side leads 28 are located outside of the periphery of the die 12 to provide access for wire bonding the wires 36. Stated differently, the bonding sites 40 are cantilevered with respect the outside edges of the die 12. As previously stated, the back side leads 28 provide electrical paths between selected bond pads 22 on the die 12, and selected ball bonding pads 32 on the circuit side leads 26. Electrical paths are thus provided to ball bonding pads 32 that would otherwise be inaccessible due to design/space rules associated with the circuit side leads 26 and the ball bonding pads 32. In addition, the back side leads 28 provide electrical paths between selected bond pads 22 and the ground and/or power plane 42 (FIG. 5B). In this regard conventional metal leadframes do not include ground and/or power planes.

Following the wire bonding step, and as shown in FIG. 4D, an encapsulating step is performed. During the encapsulating step, the plastic body 14 is formed on either side of the multi layered leadframe 24. The plastic body 14 encapsulates the leadframe 24, the die 12, the wires 36 and the associated wire bonds. The plastic body 14 has a peripheral shape that corresponds to, but is slightly larger, than the footprint of the die 12 (e.g., 1.2×). The plastic body 14 can comprise a molded plastic, such as a Novolac based epoxy. In addition, the plastic body 14 can be formed with a desired size and shape using a transfer molding process, and then cured in an oven. The plastic body 14 includes openings 62 that align with the ball bonding pads 32 on the circuit side leads 26. The openings 62 provide access to the ball bonding pads 32 for forming the terminal contacts 16 thereon.

Following the encapsulating step, and as shown in FIG. 4E, a terminal contact forming step is performed for forming the terminal contacts 16. This step can be performed by bonding the terminal contacts 16 on the ball bonding pads 32. For example, the terminal contacts 16 can comprise metal balls bonded to the ball bonding pads 32 using a suitable process such as reflow bonding. The terminal contacts 16 can also be formed using a ball bumper apparatus, a stud bumper apparatus or a wire bonder apparatus. During the bonding process the openings 62 in the plastic body 14 facilitate alignment and electrical insulation of the terminal contacts 16. In addition, the ball bonding pads 32 can include a metal layer, such as copper plating or solder flux, to facilitate the bonding process.

As an alternative to a bonding process, the terminal contacts 16 can comprise metal bumps deposited on the ball bonding pads 32 using a suitable deposition process, such as stenciling and reflow of a solder alloy. Similarly, the terminal contacts 16 can be formed by electrolytic deposition or by electroless deposition of solder or another metal.

Following the terminal contact forming step, a singulating step can be performed to singulate the package 10 from the circuit side leadframe strip 44 and the back side leadframe strip 52. Also during the singulating step, the connecting bars 50, 58 and the side rails 46, 54 are trimmed from the package 10. The singulating step can be performed using a suitable apparatus such as a punch, a shear or a saw.

As shown in FIG. 4E, the completed package 10 includes the semiconductor die 12, the multi layer leadframe 24 and the terminal contacts 16 in a dense area array. The package 10 also includes the circuit side leads 26, and the back side leads 28, which form the internal lead system for the package 10, and provide electrical paths between the bond pads 22 on the die 12 and the terminal contacts 16. In addition, the back side leads 28 provide electrical paths to terminal contacts 16 that would otherwise be inaccessible, and provide electrical paths from selected bond pads 22 to the ground and/or power plane 42.

Referring to FIGS. 6A and 6B, a multi chip module system 64 that includes multiple semiconductor packages 10 is illustrated. The multi chip module system 64 can be configured for performing a specific function such as memory storage. The multi chip module system 64 includes a module substrate 66 having patterns of electrodes 68 configured for flip chip mounting the packages 10 to the module substrate 66. The terminal contacts 16 on the packages 10 can be bonded to the electrodes 68 on the module substrate 66 using a suitable bonding process, such as solder reflow or thermode bonding. The electrodes 68 are in electrical communication with conductors 70 formed on the module substrate 66 in a required circuit pattern. In addition, the conductors 70 are in electrical communication with an edge connector 72 which provides a connection point from the outside to the multi chip module 64.

Referring to FIG. 7, a system in a package 74 (SIP) that includes multiple semiconductor packages 10 is illustrated. The system in a package 74 can be configured to perform a desired electrical function such as micro processing. In addition, each package 10 can have a different electrical configuration, such as a micro controller, a microprocessor or a flash memory. The system in a package 74 includes a package substrate 76 wherein the packages 10 are flip chip mounted. The package substrate 76 also includes electrodes and conductors (not shown) which electrically connect the packages 10 in a required electrical configuration. The package substrate 76 also includes package leads 78 in electrical communication with the packages 10. The system in a package 74 also includes a package body 80 formed of a molded plastic, or other suitable material, which encapsulates the package substrate 76 and the packages 10.

Referring to FIG. 8, a computer system 82 includes one or more packages 10. The packages 10 can be mounted to the computer system 82 in a suitable manner, such as on the multi chip module system 64 of FIG. 6A. In addition, the packages 10 can be configured to perform a desired function in the computer system 82 such as memory storage or micro processing.

Thus the invention provides an improved semiconductor package, a method for fabricating the package, and systems incorporating the package. While the invention has been described with reference to certain preferred embodiments, as will be apparent to those skilled in the art, certain changes and modifications can be made without departing from the scope of the invention as defined by the following claims.

What is claimed is:

1. A method for fabricating a semiconductor package comprising:

providing a first leadframe comprising a plurality of first leads comprising a plurality of pads in an area array;

attaching a semiconductor die to the first leads;

providing a second leadframe comprising a plurality of second leads configured to provide electrical paths between the die and selected pads on the first leads;

attaching the second leads to the first leads;

wire bonding the first leads and the second leads to the die; and forming a plurality of terminal contacts on the pads.

2. The method of claim 1 wherein the second leadframe includes a ground and/or power plane in electrical communication with the second leads.

3. The method of claim 1 wherein the terminal contacts comprise bumps or balls and the area array comprises a grid array.

4. The method of claim 1 wherein the second leads comprise angled connecting segments attached to the first leads and configured to span a gap between a circuit side and a back side of the die.

5. The method of claim 1 wherein the attaching step comprises welding, brazing, soldering or conductive adhesive bonding the second leads to the first leads.

6. A method for fabricating a semiconductor package comprising:

providing a semiconductor die comprising a circuit side, a back side and a peripheral edge;

providing a first leadframe comprising a plurality of first leads configured for attachment to the circuit side and comprising a plurality of first bonding sites;

providing a second leadframe comprising a plurality of second leads comprising a plurality of second bonding sites and angled connecting segments configured to span a gap between the circuit side and the back side;

attaching the die to the first leads;

attaching the second leadframe to the first leadframe with the second bonding sites located proximate to the back side and outside of the peripheral edge; and wire bonding the die to the first bonding sites and to the second bonding sites.

7. The method of claim 6 further comprising forming a plurality of terminal contacts on the first leadframe in electrical communication with the first leads.

8. The method of claim 6 further comprising forming a plastic body on the die, on the first leadframe and on the second leadframe.

9. The method of claim 6 wherein the first leads include a plurality of ball bonding pads in a grid array and the second leads are configured to provide electrical paths to selected ball bonding pads.

10. A method for fabricating a semiconductor package comprising:
   providing a first leadframe comprising a plurality of first leads;
   providing a second leadframe comprising a ground and/or power plane and a plurality of second leads in electrical communication with the plane;
   attaching a semiconductor die to the first leads;
   attaching the second leadframe to the first leadframe; and
   wire bonding the die to the first leads and to the second leads.

11. The method of claim 10 wherein the attaching the second leadframe to the first leadframe step comprises forming a conductive layer therebetween.

12. The method of claim 10 further comprising forming a plurality of terminal contacts on the first leads in an area array.

13. The method of claim 10 further comprising forming a plastic body on the first leadframe, on the second leadframe and on the die.

14. The method of claim 10 wherein the second leads comprise angled connecting segments configured to span a gap between a circuit side and a back side of the die.

15. A method for fabricating a semiconductor package comprising:
   providing a semiconductor die having a circuit side, a back side and a peripheral edge;
   attaching a plurality of first leads having a plurality of first bonding sites to the circuit side;
   attaching a plurality of second leads to the first leads having a plurality of second bonding sites located proximate to the back side and outside of the peripheral edge; and
   wire bonding the die to the first bonding sites and to the second bonding sites.

16. The method of claim 15 wherein the first leads are contained on a first leadframe and the second leads are contained on a second leadframe.

17. The method of claim 15 wherein at least some of the second leads are in electrical communication with a ground and/or power plane.

18. The method of claim 15 further comprising encapsulating the die.

19. A method for fabricating a semiconductor package comprising:
   providing a semiconductor die having a circuit side, a back side and a peripheral edge;
   attaching a multi layered metal leadframe to the die comprising a plurality of first leads attached to the circuit side, a plurality of pads on the first leads in an area array, a plurality of second leads attached to the first leads and a ground and/or power plane in electrical communication with at least some of the second leads;
   wire bonding the die to the first leads and to the second leads; and
   forming a plurality of terminal contacts on the pads.

20. The method of claim 19 wherein the terminal contacts comprise bumps or balls in a grid array.

21. The method of claim 19 further comprising encapsulating the die and the leadframe.

22. The method of claim 19 wherein the second leads comprise angled connecting segments configured to span a gap between the circuit side and the back side.

* * * * *